United States Patent
Hanaoka et al.

(10) Patent No.: US 6,864,584 B2
(45) Date of Patent: Mar. 8, 2005

(54) SEMICONDUCTOR DEVICE

(75) Inventors: Yuko Hanaoka, Tokyo (JP); Kenji Hinode, Tsukuba (JP); Kenichi Takeda, Hachioji (JP); Daisuke Kodama, Hachioji (JP); Noriyuki Sakuma, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 112 days.

(21) Appl. No.: 10/272,942

(22) Filed: Oct. 18, 2002

(65) Prior Publication Data

US 2003/0080433 A1 May 1, 2003

(30) Foreign Application Priority Data

Oct. 25, 2001 (JP) .................................... 2001-327116

(51) Int. Cl.⁷ .................... H01L 23/48; H01L 23/52; H01L 29/40
(52) U.S. Cl. ........................ 257/762; 257/765
(58) Field of Search .................... 257/762, 765, 257/771, 751, 758

(56) References Cited

U.S. PATENT DOCUMENTS

| | | | |
|---|---|---|---|
| 6,288,447 B1 | | 9/2001 | Amishiro et al. |
| 6,291,885 B1 | * | 9/2001 | Cabral et al. ............... 257/751 |
| 6,355,555 B1 | * | 3/2002 | Park ........................... 438/634 |
| 6,569,767 B1 | * | 5/2003 | Fujisawa et al. ............ 438/687 |
| 6,707,156 B2 | * | 3/2004 | Suzuki et al. ............... 257/758 |
| 2002/0024141 A1 | | 2/2002 | Amishiro et al. |

FOREIGN PATENT DOCUMENTS

JP 2000-216264 8/2000

OTHER PUBLICATIONS

"Dependence of Electrical Resistivity and Microstructure on Cu Layer Thickness" Central Research Lab., Hitachi, Ltd., Hanaoka et al., p 30.
"Fabrication and Performance Limits of Sub–0.1 μm Cu Interconnects" T.S. Kuan et al., Mat. Res. Soc. Symp. Proc. vol. 612, 2000 Materials Research Society.

* cited by examiner

*Primary Examiner*—S. V. Clark
(74) *Attorney, Agent, or Firm*—Antonelli, Terry, Stout & Kraus, LLP

(57) ABSTRACT

In extremely minute copper wiring the width or the thickness of which is equal to or shorter than approximately the double length of the mean free path of a copper atom, a value of the resistance may be larger, compared with aluminum wiring of the same extent and it is difficult to realize wiring having small resistance. To solve such a problem, aluminum wiring is used for wiring having form in which the respective resistivities $\rho$ of both wirings have the relation of $\rho_{Al} < \rho_{Cu}$ and copper wiring is used for wiring having form in which the respective resistivities $\rho$ of both wirings have the relation of $\rho_{Al} \geq \rho_{Cu}$. As a result, a semiconductor device which has small resistance, transmits a signal at high speed and is provided with a multilayer wiring layer can be realized.

20 Claims, 8 Drawing Sheets

SEMICONDUCTOR DEVICE

BACKGROUND OF THE INVENTION

1. Field of the Invention

The present invention relates to a semiconductor device, further detailedly relates to a semiconductor device which has small resistance, transmits a signal at high speed and is provided with a multilayer interconnection layer and its manufacturing process.

2. Description of the Related Art

To accelerate LSI, the miniaturization of a component and making wiring minute and a multilayer are promoted. For wiring, being minute, simultaneously the reduction of the resistance and the enhancement of the reliability are required. For the material of wiring, aluminum or an aluminum alloy (hereinafter called aluminum wiring) which is easy to work, is low-priced and has relatively small resistance has been widely used. However, it is required to more reduce the resistance of wiring and recently, wiring mainly made of a copper conductive layer (hereinafter called copper wiring) has been used for the material of wiring in LSI provided with minute wiring in place of aluminum wiring. For the resistivity in bulk of wiring material, aluminum is 3 to 3.5 $\mu\Omega$·cm, copper is 2 $\mu\Omega$·cm and the resistivity of copper is smaller. Copper wiring is excellent in resistance to stress migration and resistance to electromigration, compared with aluminum wiring and is also advantageous as the material of wiring in that respect.

Generally, for the production of aluminum wiring and copper wiring, in the case of aluminum wiring, after aluminum is deposited on a substrate, it is etched in a predetermined shape using photoresist by RIE (reactive ion etching) to remove unnecessary aluminum and wiring is formed, however, in the case of copper wiring, a damascening process that after a groove and a hole are formed on an insulating film, a copper film is deposited, unnecessary copper on the insulating film except the groove and the hole is removed and wiring is formed is used.

Generally, as a metallic thin film becomes thin, the resistivity increases differently from a case of bulk. In the case of a copper thin film, it is reported that when the copper thin film becomes extremely thin, the resistivity also increases. Further, it is reported in Fabrication and Performance Limits of sub 0.1 $\mu$m Cu interconnects, Materials Technology and Reliability for Advanced Interconnects and Low-k Dielectrics Symposium, Materials Research Society Symposium Proceedings, Vol. 612 by T. S. Kuan et al. on Apr. 23 to 27, 2000 that the increase of the resistance of copper wiring formed by the damascening process is further larger than the case of the thin film. For the reason, the scattering of electrons by irregularities of the surface of the wiring and the effect of a barrier film made of high-melting point metal around the copper wiring by the damascening process are reported (refer to Japanese published unexamined patent application No. 2000-216264). However, in case there are few irregularities on the surface of the wiring and the barrier film has little effect, the resistivity of the copper wiring also increases as the width w or the thickness t of the wiring becomes small.

As a result of examining the increase of the resistivity of copper wiring caused by making wiring minute in detail, it proves that the increase of the resistivity is caused by a fact that the mean free path of an electron of a copper atom is 45 nm and is large and the resistivity of the wiring is represented by a function also depending upon the width w of the wiring in addition to the thickness t (refer to Dependency upon thickness of Cu film of resistivity and grain structure, Proceedings of 7th research of atomic migration-stress problem in LSI wiring by Hanaoka et al. on Jul. 5 (Thursday) and 6 (Friday), 2000). In other words, it is considered that a phenomenon that when copper wiring is made minute, the resistance of the wiring abruptly increases is caused by the physical property of Cu itself and the phenomenon cannot be avoided by a method of manufacturing the wiring.

For such a reason, though copper wiring is used to reduce the resistance of wiring, the resistance of copper wiring made minute increases independent of its manufacturing process. Then, the realization of such wiring and the structure that the resistance of the wiring does not increase even if the wiring is made extremely minute has been desired.

SUMMARY OF THE INVENTION

In the invention, to prevent the resistivity of copper wiring from increasing by making the copper wiring minute, a method of selecting such wiring material that the resistivity of wiring is minimum for the width of the wiring, concretely a method of using aluminum wiring for wiring having a dimension in which the resistivity of copper wiring is larger than that of aluminum wiring, that is, wiring having the form of $\rho_{Cu} > \rho_{Al}$ and using copper wiring for wiring having the form of $\rho_{Al} \geq \rho_{Cu}$ is taken.

Also, as it is troublesome to provide both copper wiring and aluminum wiring in the same layer in case a semiconductor device having multilayer interconnection structure is actually produced, a manufacturing process can be simplified by using aluminum wiring for wirings in the same layer including wiring width the resistivity of which is smaller in case aluminum wiring is used and using copper wiring for wirings in the same layer including wiring width the resistivity of which is not larger than that of aluminum wiring.

Figure 1:
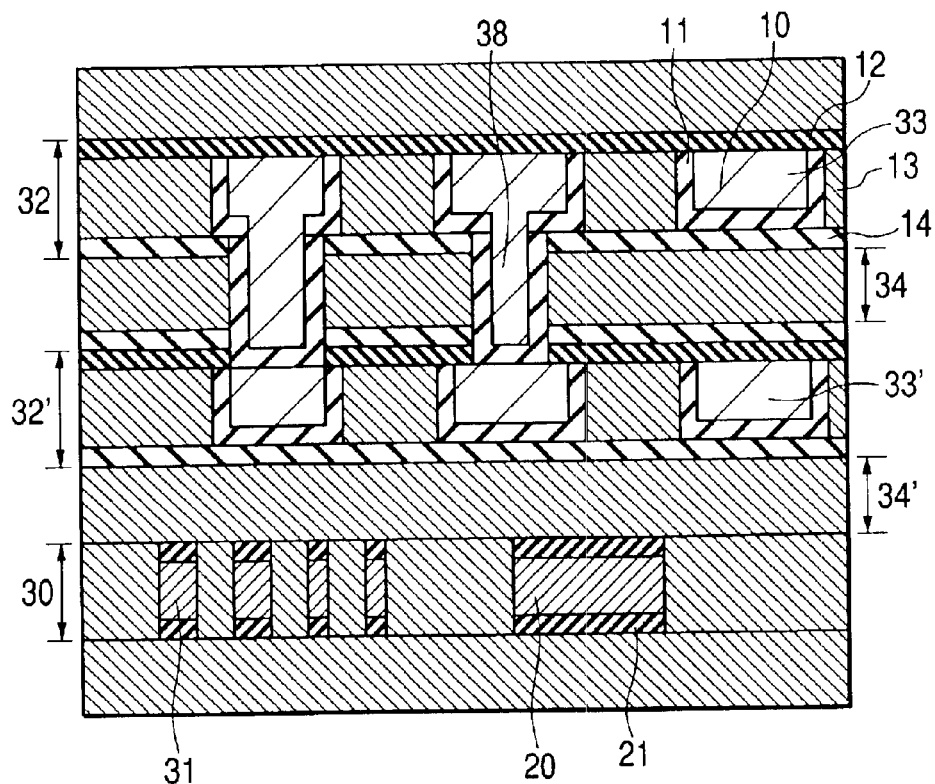
FIG. 1 is a sectional view showing the multilayer interconnection structure of a semiconductor device according to the invention.

DETAILED DESCRIPTION OF THE
PREFERRED EMBODIMENTS

Referring to the drawings, embodiments of the invention will be described in detail below. In all drawings in this patent application, the same reference number is allocated to a member having the same function and the description is not repeated.

Figure 5:
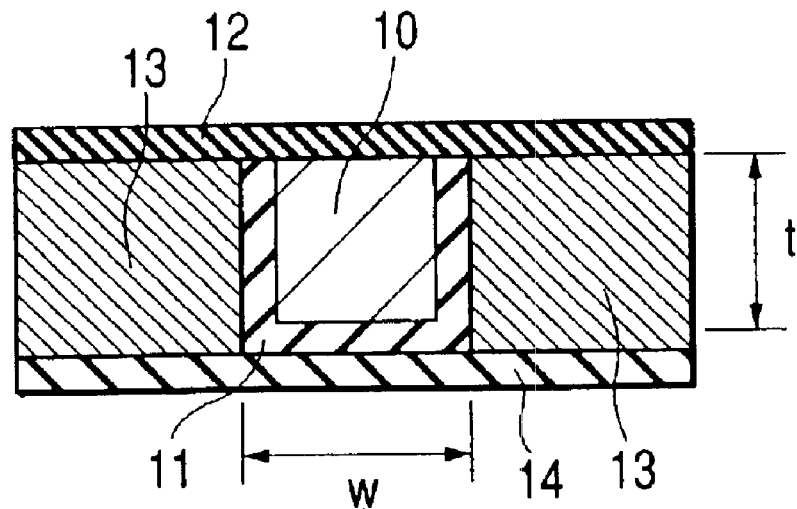
FIG. 5 is a schematic sectional view showing general copper wiring.
Figure 6:
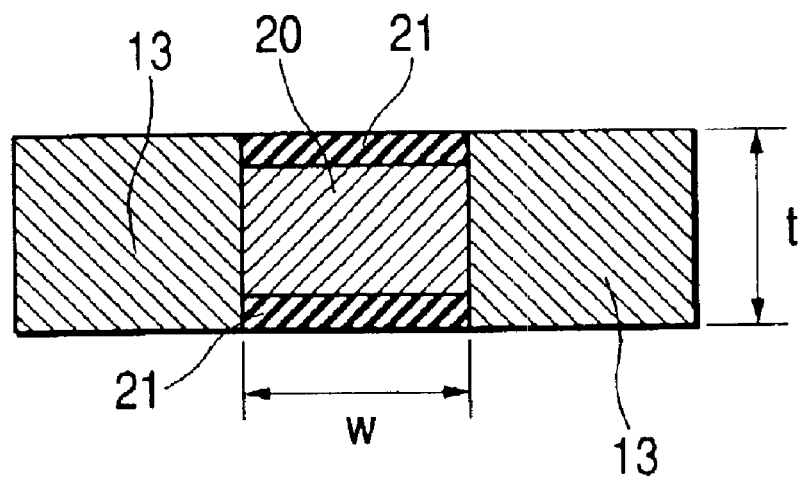
FIG. 6 is a schematic sectional view showing general aluminum wiring.

In the invention, a semiconductor circuit having a cross section shown in FIGS. 5 and 6 and provided with copper wiring or aluminum wiring will be produced and relation among the thickness t, the width w and the resistivity of the wiring will be examined.

FIG. 5 is a schematic sectional view showing a produced copper wiring sample. Copper wiring is produced by a damascening process and barrier metal 11 is formed on the side and on the bottom of the copper wiring 10. A barrier film 12 over the wiring is made of a film including silicon. A reference number 13 denotes an insulating film that surrounds the copper wiring and 14 denotes an etching stopper film required in a process for producing a groove for burying the copper wiring in the insulating film in the damascening process. The dimensions of the width w and the thickness t of the wiring are parameters varied according to the requirements of the sample. The dimension of the width w of the wiring includes the width of the barrier metal 11 as shown in FIG. 5. The dimension of the thickness t of the wiring also includes the thickness of the barrier metal.

FIG. 6 is a schematic sectional view showing a produced aluminum wiring sample. Aluminum wiring is produced by RIE. Barrier metal 21 is formed on the bottom and on the upper surface of the aluminum wiring 20. A reference number 13 denotes an interlayer film that surrounds the aluminum wiring. The dimensions of the width w and the thickness t of the wiring are parameters varied according to the requirements of the sample. The thickness t of the wiring includes the thickness of the barrier metal 21.

Figure 7:
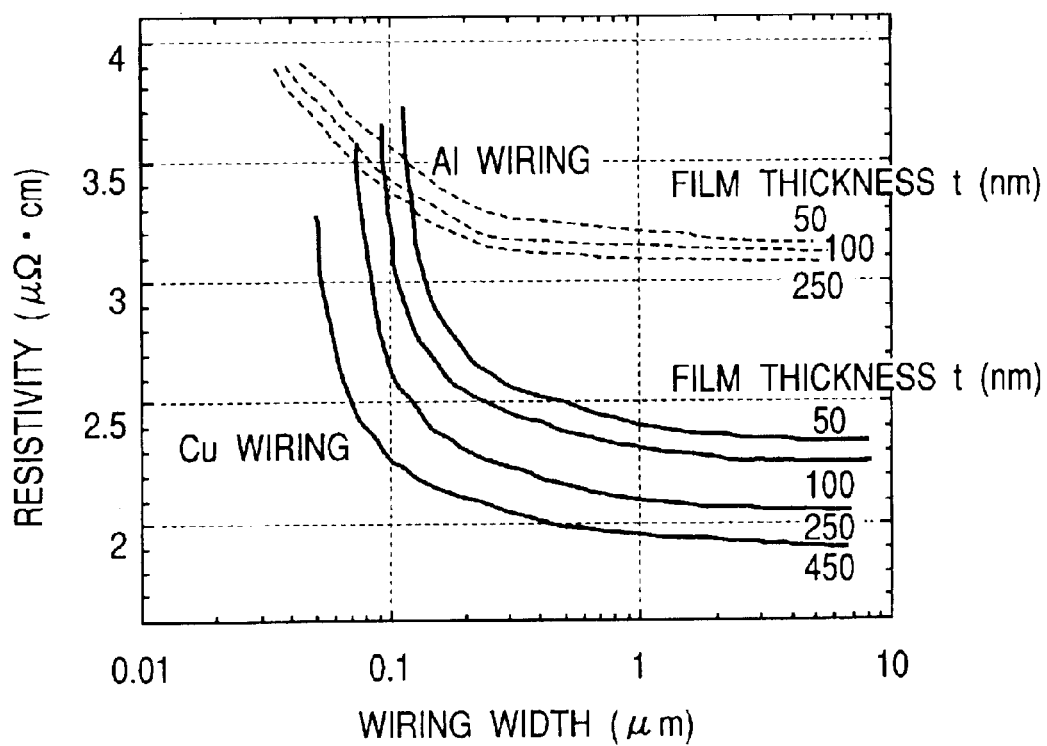
FIG. 7 is a graph showing relation between the form of wiring and the resistivity of wiring.

A semiconductor device provided with the cross sections of the copper wiring structure shown in FIG. 5 and the aluminum wiring structure shown in FIG. 6 is produced and the resistivity of the copper wiring and the aluminum wiring is measured. FIG. 7 shows the result. The result shows that in an area in which the thickness t of the copper wiring is smaller than 450 nm, the resistivity of the copper wiring starts to increase as the width of the wiring decreases from the vicinity in which the width of the wiring is smaller than 0.5 μm and abruptly increases from the vicinity in which the width of the wiring is 0.2 μm.

In the meantime, for the aluminum wiring, the abrupt increase of the resistance does not occur in the width of the wiring of approximately 0.2 μm or the dimension of the thickness. The reason is that the mean free path of aluminum (Al) is 20 nm, is approximately a half and is smaller, compared with 45 nm which is the mean free path of copper (Cu).

In the case of a bulk or wiring having large width, the resistivity of Cu is naturally smaller than that of Al. However, in the case of wiring width of approximately 0.2 μm or the dimension of the thickness, the increase of the resistivity of the copper wiring as the wiring becomes minute abruptly occurs, while that of the aluminum wiring relatively slowly occurs. Therefore, in case the copper wiring and the aluminum wiring are the same in the thickness t and the width w, the resistivity of the copper wiring increases as the wiring becomes minute, approaches the resistivity of the aluminum wiring, becomes equal to it and then, becomes larger than it. That is, we verified that in the case of extremely minute wiring, an area in which the resistivity of the copper wiring was larger than that of the aluminum wiring existed as shown in FIG. 7.

Figure 2:
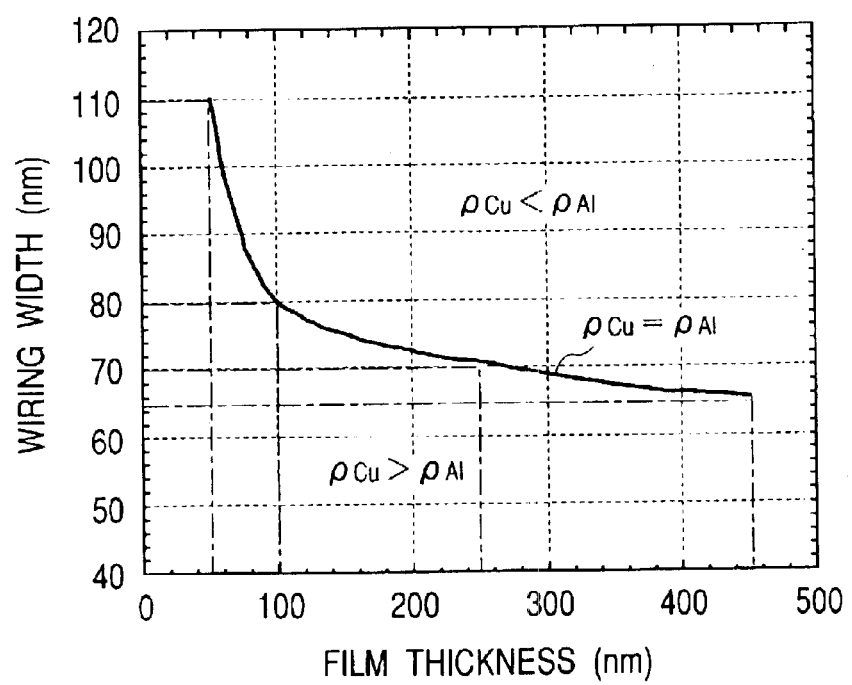
FIG. 2 is a graph showing values of the thickness and the wiring width when the respective resistivities of copper wiring and aluminum wiring are equal.

FIG. 2 is a graph acquired by plotting the following wiring width w based upon the following wiring thickness t after wiring width w and wiring thickness t where "$\rho_{Al}=\rho_{Cu}$" is met are read from the result of the measurement shown in FIG. 7. FIG. 2 shows the form of the wiring when full lines shown in a graph in FIG. 7 pass each point of "$\rho_{Al}=\rho_{Cu}$" Therefore, an upper part on the right side of a full line shown in FIG. 2 shows an area of wiring form where "$\rho_{Cu}<\rho_{Al}$" is met and a lower part on the left side of the full line shows an area when wiring form where "$\rho_{Cu}>\rho_{Al}$" is met is made more minute.

For example, when the wiring width w is approximately 90 nm equal to approximately the double of 45 nm which is the mean free path of Cu in case the thickness t of copper wiring is 75 nm, the resistivity of the Cu wiring becomes the same extent to the resistivity of aluminum wiring and further, when the copper wiring is made minute, the resistivity of the aluminum wiring becomes smaller.

When the wiring width is larger in case copper wiring is thin and conversely when the wiring width is smaller in case the copper wiring is thick, the resistivity of the copper wiring becomes larger than that of aluminum wiring having the same form.

Then, in the invention, aluminum wiring is used for wiring having form that the resistivity of copper wiring is larger than that of aluminum wiring, that is, form where "$\rho_{Cu}>\rho_{Al}$" is met and copper wiring is used for wiring having form where "$\rho_{Al}\geq\rho_{Cu}$" is met.

In other words, as shown in the graph shown in FIG. 2 and showing relation between wiring width w and wiring thickness t, wiring having a dimension in the area on the left lower side where "$\rho_{Cu}>\rho_{Al}$" is met is formed by Al and wiring in the area on the right upper side including the full line showing "$\rho_{Cu}=\rho_{Al}$" where "$\rho_{Cu}<\rho_{Al}$" is met is formed by Cu.

However, as it increases the number of processes in the manufacturing process and makes the manufacturing process troublesome to provide both Cu wiring and Al wiring in the same layer in case a semiconductor device having multilayer interconnection structure is actually produced, the manufacturing process can be simplified and the increase of the resistance of wiring can be solved by forming wirings in a layer including minute wiring width the resistance of which becomes smaller in case Al is used by aluminum wiring and forming wirings in a layer including wiring width the resistance of which becomes smaller in case Cu is used for all wirings, compared with a case that Al is used by copper wiring.

That is, in case metal forming wiring is selected every wiring layer, wirings in a layer including wiring width having any dimension equivalent to the part of "$\rho_{Cu}>\rho_{Al}$"

located on the left lower side of the full line showing "$\rho_{Cu}=\rho_{Al}$" in the graph shown in FIG. 2 are formed by Al, however, in the wiring layer, wiring having any dimension equivalent to the full line showing "$\rho_{Cu}=\rho_{Al}$" and the part of "$\rho_{Cu}<\rho_{Al}$" on the right upper side may be also included. In the meantime, wirings in a layer including only the wirings having form equivalent to the full time showing "$\rho_{Cu}=\rho_{Al}$" and the part of "$\rho_{Cu}<\rho_{Al}$" on the right upper side are formed by Cu.

More concretely, when aluminum wiring is used for wiring the width w of which is smaller than 0.11 μm in case the thickness t of a wiring layer is 0.05 μm or less, the wiring resistance of the whole circuit can be reduced. In such an area of minute wiring width that wiring width w is 0.08 μm or less, a design value required for the thickness t of wiring is at most approximately 0.5 μm and in the case of such wiring form, the resistance of aluminum wiring is smaller independent of the thickness t.

In case the thickness t of a wiring layer is 0.05 to 0.10 μm, points at which the resistance of aluminum wiring is smaller depending upon the thickness exist when wiring width w is between 0.11 μm and 0.08 μm as shown in FIG. 2. The invention proposes the reduction of the resistance by using aluminum wiring for wiring having smaller width than 0.09 μm equivalent to the double length of the mean free path of Cu particularly in an area including these dimensions of the thickness and using copper wiring for wiring having larger width.

The increase of the resistivity of wiring corresponding to the length of the mean free path of wiring material means that the resistivity of wiring is determined by only the dimension of the wiring. Therefore, independent of whether a diffused barrier layer made of high-melting point metal of Cu exists in wiring structure or not, the resistance of wiring increases. In other words, the invention in which extremely minute wiring having form that $\rho_{Al}<\rho_{Cu}$ is formed by Al to reduce the resistance of the wiring is also effective for wiring having copper wiring structure without a diffused barrier for example.

As the resistance of wiring is reduced and the capacity is reduced when an insulating film around such wiring structure according to the invention is formed by low-dielectric constant material, such wiring is advantageous as high frequency signal wiring.

When aluminum wiring is used for minute and long wiring and copper wiring is used for thick and short wiring based upon relation described above between wiring structure and the resistivity, the resistance of wiring optimum to wiring width can be reduced. Therefore, the resistance of desirable wiring can be reduced by using aluminum wiring for minute wiring in a cell of a circuit block and using copper wiring for wiring between cells.

Further, in both cases of aluminum wiring and copper wiring, it is natural that various other metals are added to be an alloy and the alloy may be also used for wiring material.

The thickness of the metallic barrier film 11 is included in the width w and the thickness t of the copper wiring shown in FIG. 5. That is, the resistivity equivalent to the thickness of the barrier film 11 is also included in the resistivity $\rho_{Cu}$ shown in FIG. 2 and acquired by measuring relation between the thickness t and the width w. As the barrier film is made of tantalum or tantalum nitride for example and has large resistance, the quantity of the increase of the resistance due to the barrier film may be larger than the quantity of the increase of the resistance of Cu itself in copper wiring depending upon a case as the width of the copper wiring is made minute. Then, the resistivity of the whole wiring including the resistivity of Cu forming the copper wiring and the resistivity of the barrier metal formed under and on the sides of Cu for preventing the diffusion of Cu is examined and the contribution of the whole barrier metal to the resistance of the wiring is examined. In general copper wiring, the thickness of barrier metal is approximately 20 nm and the thickness of the copper wiring is 100 nm or more. As a result of the simulation of wiring structure in which the thickness of barrier metal is set to 20 nm and the thickness of copper wiring is set to 100 nm, in wiring the minimum width w of which is 0.08 μm and for which copper wiring is used in the invention, the contribution of the barrier metal to the resistance of the wiring is at most approximately 2% of the resistance of the whole wiring. Therefore, it is considered in the invention that an effect of the increase of the resistivity of the barrier metal in the copper wiring structure upon the whole wiring can be ignored. However, though the effect is small, it is also a fact that the quantity of the barrier film (at least 2%) is included in the result shown in FIG. 2. Therefore, depending upon the thickness of the barrier film, a position of the full line showing form that $\rho_{Cu}=\rho_{Al}$ in the graph shown in FIG. 2 may slightly vary.

First Embodiment

Figure 4:
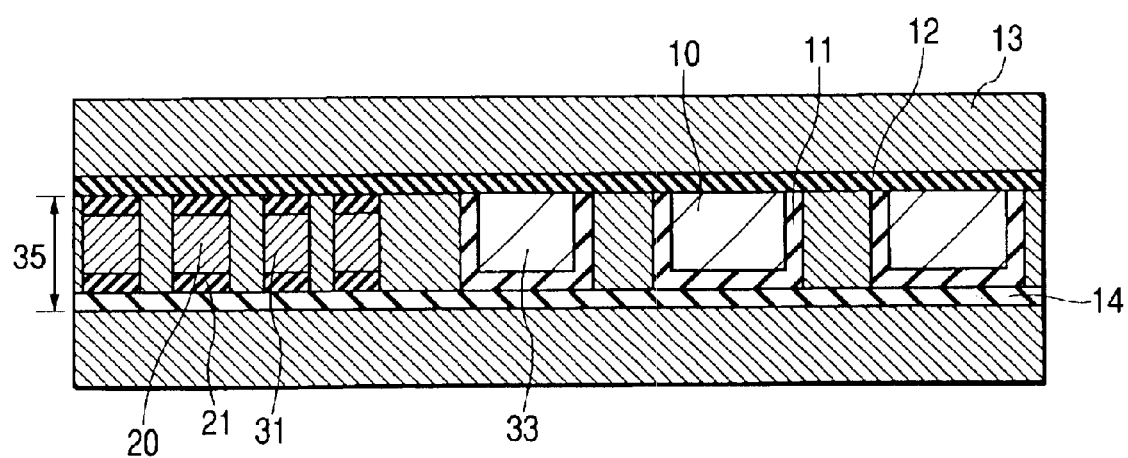
FIG. 4 is a sectional view showing a semiconductor device according to the invention.
Figure 8:
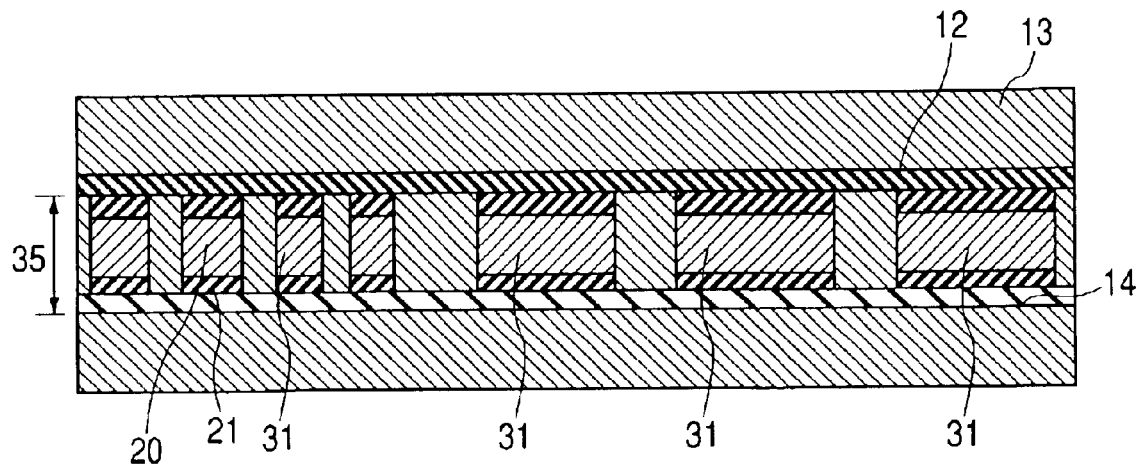
FIG. 8 is a sectional view showing a semiconductor device according to the invention.
Figure 9:
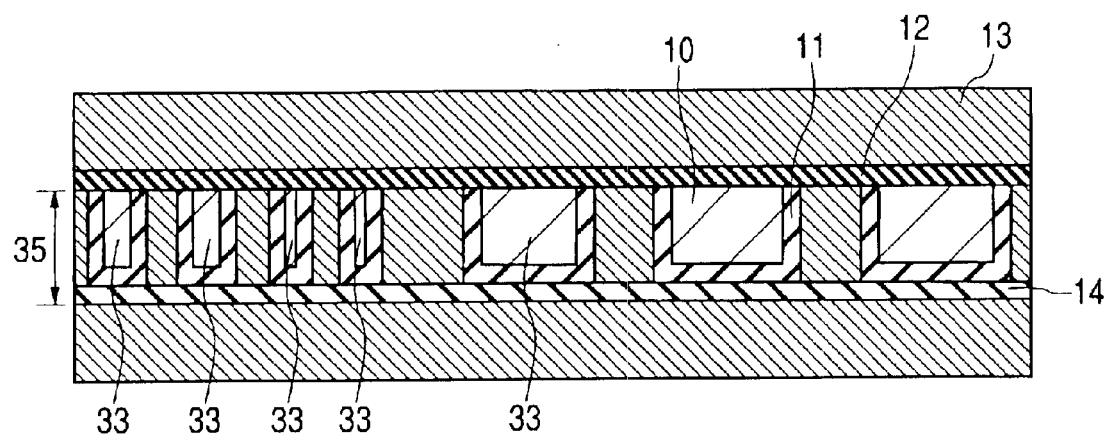
FIG. 9 is a sectional view showing a semiconductor device according to the invention.

FIG. 4 is a sectional view showing the wiring structure of a semiconductor device according to the invention. Copper wiring is produced by the damascening process and aluminum wiring is produced by RIE. Aluminum wiring 31 is minute wiring having form that $\rho_{Al}<\rho_{Cu}$, a reference number 20 of the aluminum wiring 31 is equivalent to a part of Al and 21 is equivalent to a part of a diffused barrier. Copper wiring 33 is wiring having form that $\rho_{Al}>\rho_{Cu}$, a reference number 10 of the copper wiring 33 is equivalent to a part of Cu, 11 is equivalent to a diffused barrier film made of high-melting point metal, a reference number 12 denotes a diffused barrier film made of silicon nitride and 35 and 35 denotes a wiring layer including these wirings. Wiring structure shown in FIG. 4 is provided with both the aluminum wiring and the copper wiring in a circuit, the aluminum wiring is used for wiring having form that the resistivities ρ of the wirings are $\rho_{Al}<\rho_{Cu}$ and the copper wiring is used for wiring having form that $\rho_{Al}>\rho_{Cu}$. FIG. 8 shows the same structure as the structure shown in FIG. 4 in which all wirings are formed by only aluminum wiring, FIG. 9 shows the same structure as the structure shown in FIG. 4 in which all wirings are formed by only copper wiring and samples of these two types are simultaneously produced. It is verified based upon a measured resistance value of the whole wiring in each sample shown in FIGS. 4, 8 and 9 that the semiconductor device having the wiring structure according to the invention which is shown in FIG. 4 and in which the aluminum wiring and the copper wiring are suitably used depending upon wiring width has the smallest resistance as the whole wiring.

Second Embodiment

Figure 10:
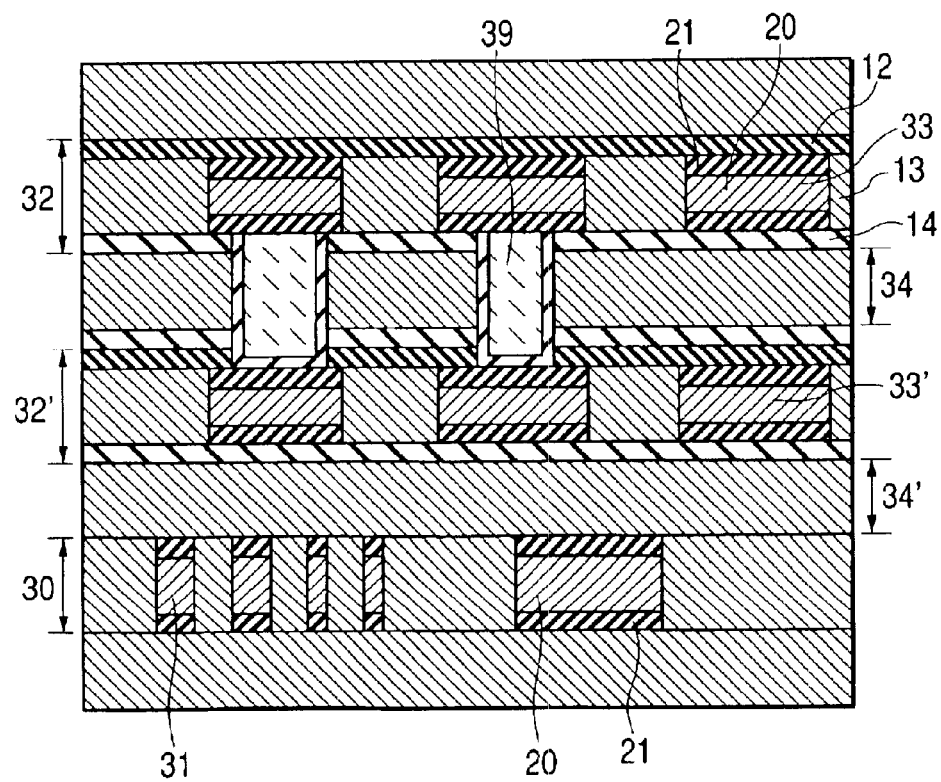
FIG. 10 is a sectional view showing the multilayer interconnection structure of a semiconductor device according to the invention.
Figure 15:
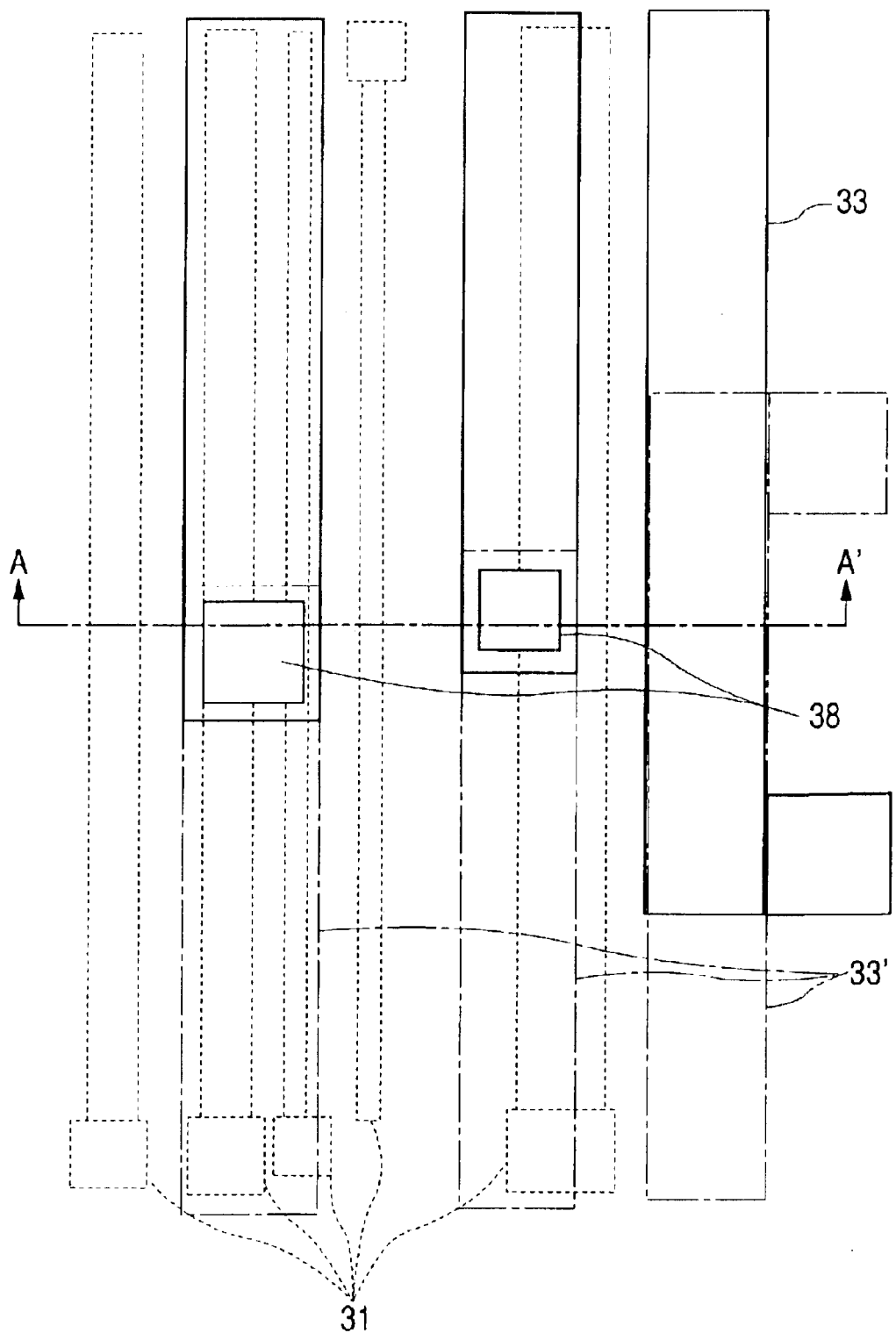
FIG. 15 shows a part of a plan showing a semiconductor device to which the invention is applied.

FIG. 15 shows a part of a plan showing the multilayer interconnection of a semiconductor device according to the invention. FIG. 1 is a sectional view showing the multilayer interconnection structure according to the invention of a part viewed along a line A—A' in FIG. 15. A wiring layer 30 is a layer formed by aluminum wiring. In this layer, minute wirings 31 having form that $\rho_{Al}<\rho_{Cu}$ are included. Wiring layers 32, 32' are formed by copper wiring. These two wiring layers include wirings 33, 33' all of which have form that $\rho_{Al} > \rho_{Cu}$. A reference number 34 denotes an interlayer insulating layer between the wiring layers. A reference number 38 denotes dual Damascene wiring which pierces the interlayer insulating layer 34 and which simultaneously forms a connecting conductive layer and the wiring layer 33. The interconnection structure shown in FIG. 1 is provided with multilayer interconnection composed of both aluminum wiring and copper wiring in a circuit, aluminum wiring is used for a layer having the wiring width and the wiring thickness of form in which the respective resistivities ρ of wirings have the relation of $\rho_{Al} < \rho_{Cu}$ as shown in FIG. 2 and copper wiring is used for a layer having the wiring width and the wiring thickness of form that $\rho_{Al} > \rho_{Cu}$. Two types of samples of a sample having such structure which is the same structure as the structure shown in FIG. 1 and which is shown in FIG. 10 (a reference number 39 in FIG. 10 denotes a plug for connecting aluminum wirings) that wirings in all layers are formed by only Al and a sample having such structure shown in FIG. 11 that wirings in all layers are formed by only Cu are simultaneously produced. As a result of measuring a resistance value of the whole wiring in each sample shown in FIGS. 1, 10 and 11, it is verified that the semiconductor device having the interconnection structure according to the invention shown in FIG. 1 in which aluminum wiring and copper wiring are suitably used depending upon wiring width has the smallest resistance as the whole wiring.

Third Embodiment

As a result of producing a semiconductor device using a so-called low-k film the dielectric constant k of which is 2.7 for the insulating film 13 buried between adjacent wirings based upon the semiconductor device equivalent to the second embodiment and provided with a cross section shown in FIG. 1, the reduction of the resistance of the wiring and the reduction of parasitic capacity between adjacent wirings can be verified.

Fourth Embodiment

A semiconductor circuit provided with a cross section shown in FIG. 4 is produced. At this time, the thickness t to of a wiring layer 35 is set to 0.045 μm, all wirings 31 having form that the wiring width w is smaller than 0.11 μm are formed by aluminum wiring and all wirings 33 the width w of which is equal to or larger than 0.11 μm are formed by copper wiring. Two types of samples of a sample shown in FIG. 8 which has the same structure as the structure shown in FIG. 4 and in which all wirings are formed by only Al and a sample shown in FIG. 9 in which all wirings are formed by only Cu are simultaneously produced. As a result of measuring a resistance value of the whole wiring in each sample shown in FIGS. 4, 8 and 9, it is verified that the semiconductor device having wiring structure according to the invention shown in FIG. 4 that aluminum wiring and copper wiring are suitably used depending upon wiring width has the smallest resistance as the whole wiring.

Fifth Embodiment

Figure 3:
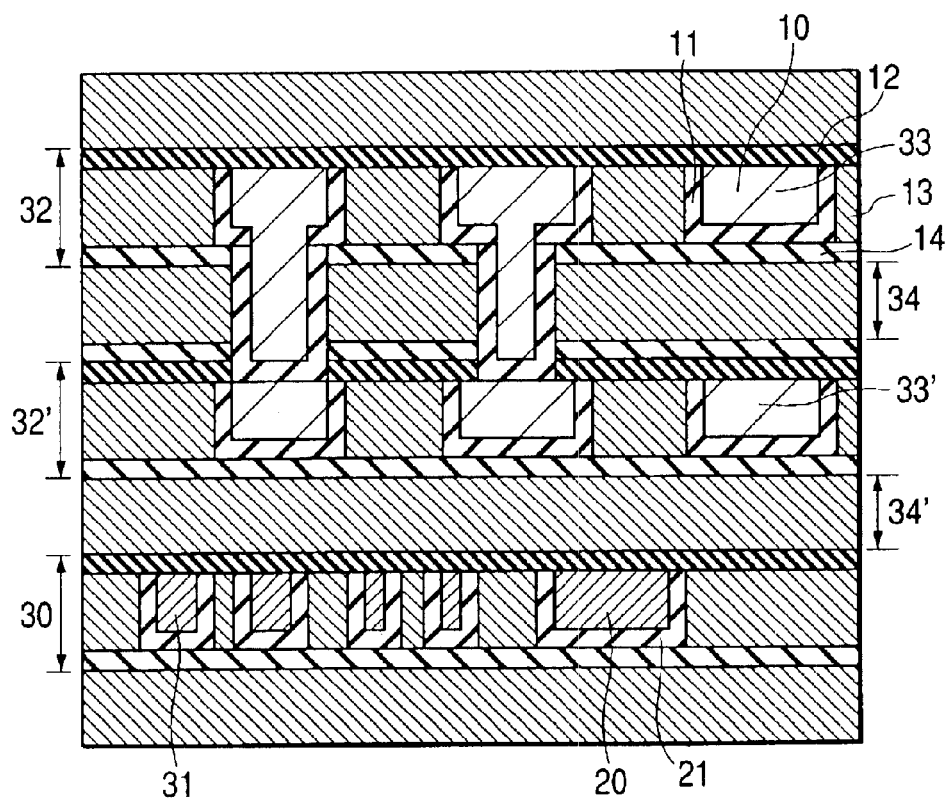
FIG. 3 is a sectional view showing the multilayer interconnection structure of a semiconductor device according to the invention.
Figure 12:
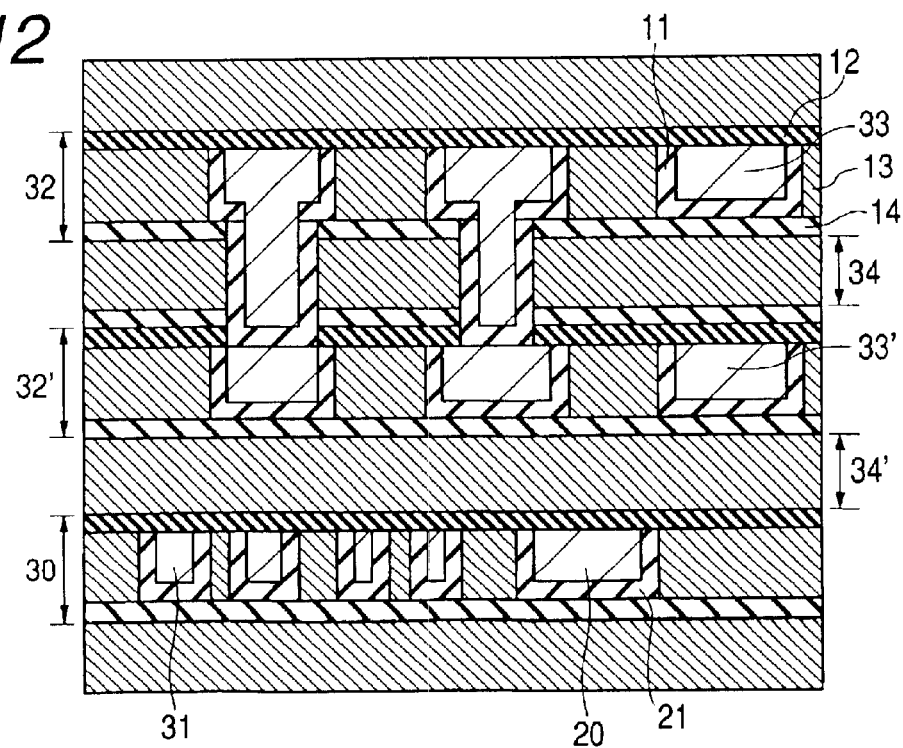
FIG. 12 is a sectional view showing the multilayer interconnection structure of a semiconductor device according to the invention.
Figure 13:
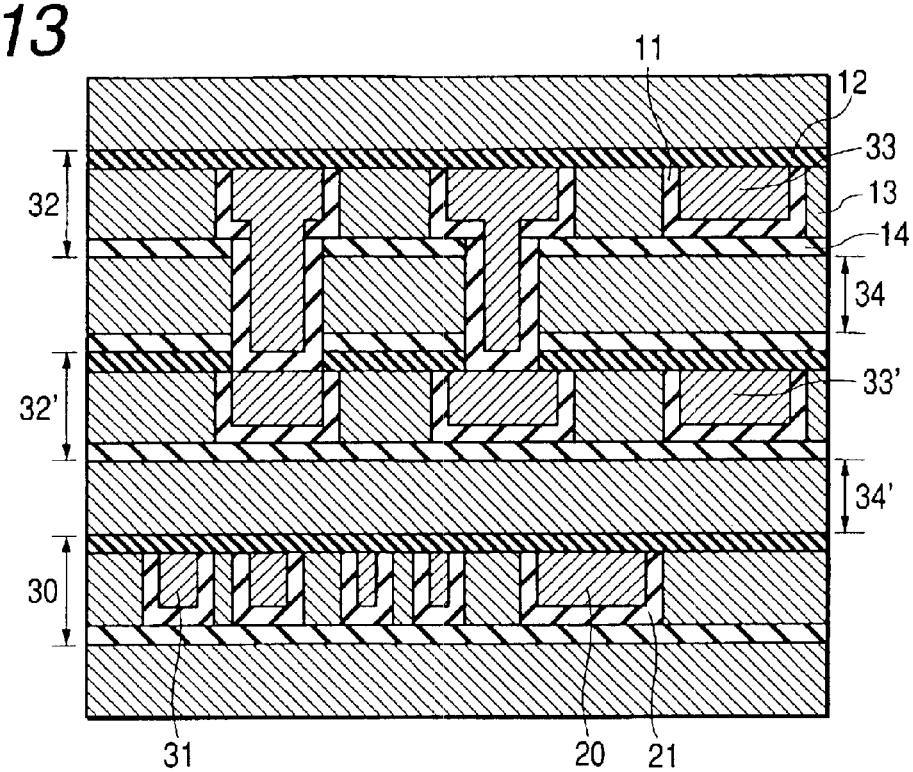
FIG. 13 is a sectional view showing the multilayer interconnection structure of a semiconductor device according to the invention.

A semiconductor circuit provided with a cross section shown in FIG. 3 is produced. For metallic wiring at this time, both copper wiring and aluminum wiring are formed by the damascening process. At this time, the thickness t of wiring layers 30, 32, 32' is all set to 0.045 μm, all wirings in the wiring layer 30 including wiring 31 having form that the wiring width w is smaller than 0.11 μm are formed by aluminum wiring and wirings in the wiring layers 32, 32' including only wiring 33 the wiring width w of which is equal to or larger than 0.11 μm are formed by copper wiring. Two types of samples of a sample shown in FIG. 12 which has Damascene structure where all wirings are formed by the damascening process as shown in FIG. 3 and in which all wirings are formed by only Cu and a sample shown in FIG. 13 in which all wirings are formed by only Al are simultaneously produced. As a result of measuring a resistance value of the whole wiring in each sample shown in FIGS. 3, 12 and 13, it is verified that the semiconductor having the interconnection structure according to the invention shown in FIG. 3 that aluminum wiring and copper wiring are suitably used depending upon wiring width has the smallest resistance as the whole wiring.

Sixth Embodiment

A semiconductor circuit provided with the cross section shown in FIG. 4 is produced. The thickness t of the wiring layer 35 at this time is set to 0.08 μm, the wirings 31 having form that the wiring width w is smaller than 0.09 μm are all formed by aluminum wiring and the wirings 33 the wiring width w of which is equal to or larger than 0.09 μm are formed by copper wiring. Two types of samples of a sample shown in FIG. 8 which has the same structure as the structure shown in FIG. 4 and in which all wirings are formed by only Al and a sample shown in FIG. 9 in which all wirings are formed by only Cu are simultaneously produced. As a result of measuring a resistance value of the whole wiring in each sample shown in FIGS. 4, 8 and 9, it is verified that the semiconductor device having the wiring structure according to the invention shown in FIG. 4 in which aluminum wiring and copper wiring are suitably used depending upon wiring width has the smallest resistance as the whole wiring.

Seventh Embodiment

Figure 11:
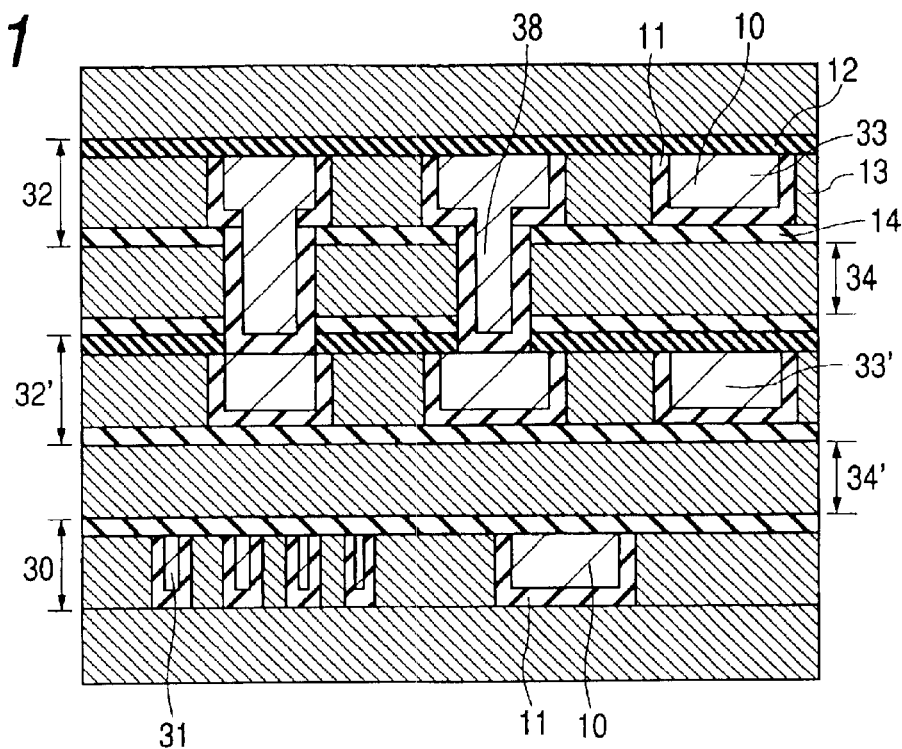
FIG. 11 is a sectional view showing the multilayer interconnection structure of a semiconductor device according to the invention.

A semiconductor circuit provided with the cross section shown in FIG. 1 is produced. At this time, the thickness t of wiring layers 30, 32 is set to 0.08 μm. The thickness t of a wiring layer 32' is set to 0.24 μm and all wirings including the wiring layer 32' are produced so that the wiring width w is equal to or larger than 0.08 μm. All wirings in the wiring layer 30 including wiring 31 having form that the wiring width w is smaller than 0.09 μm are formed by aluminum wiring and wirings in the wiring layers 32, 32' including wiring 33 produced so that the wiring width w is equal to or larger than 0.09 μm are formed by copper wiring. Two types of samples of a sample which has the same structure as the structure shown in FIG. 1, in which wirings in all layers are formed by only Al and which has structure shown in FIG. 10 (in FIG. 10, a reference number 39 denotes a plug for connecting aluminum wirings) and a sample in which wirings in all layers are formed by only Cu and which has structure shown in FIG. 11 are simultaneously produced. As a result of measuring a resistance value of the whole wiring in each sample shown in FIGS. 1, 10 and 11, it is verified that the semiconductor device having the interconnection structure according to the invention shown in FIG. 1 in which aluminum wiring and copper wiring are suitably used depending upon wiring width has the smallest resistance as the whole wiring.

Eighth Embodiment

A semiconductor circuit provided with the cross section shown in FIG. 4 is produced. At this time, the thickness t of a wiring layer 35 is set to 0.15 μm, all wirings 31 having form that the wiring width w is smaller than 0.08 μm are formed by aluminum wiring and wirings 33 the wiring width w of which is equal to or larger than 0.08 μm are formed by copper wiring. Two types of samples of a sample shown in FIG. 8 which has the same structure as the structure shown in FIG. 4 and in which all wirings are formed by only Al and a sample shown in FIG. 9 in which all wirings are formed by only Cu are simultaneously produced. As a result of measuring a resistance value of the whole wiring in each sample shown in FIGS. 4, 8 and 9, it is verified that the semiconductor device having the wiring structure according to the invention shown in FIG. 4 in which aluminum wiring and copper wiring are suitably used depending upon wiring width has the smallest resistance as the whole wiring.

Ninth Embodiment

A semiconductor circuit provided with the cross section shown in FIG. 1 is produced. At this time, the thickness t of wiring layers 30, 32, 32' is all set to 0.20 μm, all wirings in the wiring layer 30 including wiring 31 having form that the wiring width w is smaller than 0.08 μm are formed by aluminum wiring and wirings in the wiring layers 32, 32' including only wiring 33 having form that the wiring width w is equal to or larger than 0.08 μm are formed by copper wiring. Two types of samples of a sample which has the same structure as the structure shown in FIG. 1, in which wirings in all layers are formed by only Al and which has the structure shown in FIG. 10 (in FIG. 10, the reference number 39 denotes a plug for connecting aluminum wirings) and a sample in which wirings in all layers are formed by only Cu and which has the structure shown in FIG. 11 are simultaneously produced. As a result of measuring a resistance value of the whole wiring in each sample shown in FIGS. 1, 10 and 11, it is verified that the semiconductor device having the interconnection structure according to the invention shown in FIG. 1 in which aluminum wiring and copper wiring are suitably used depending upon wiring width has the smallest resistance as the whole wiring.

Tenth Embodiment

Figure 14:
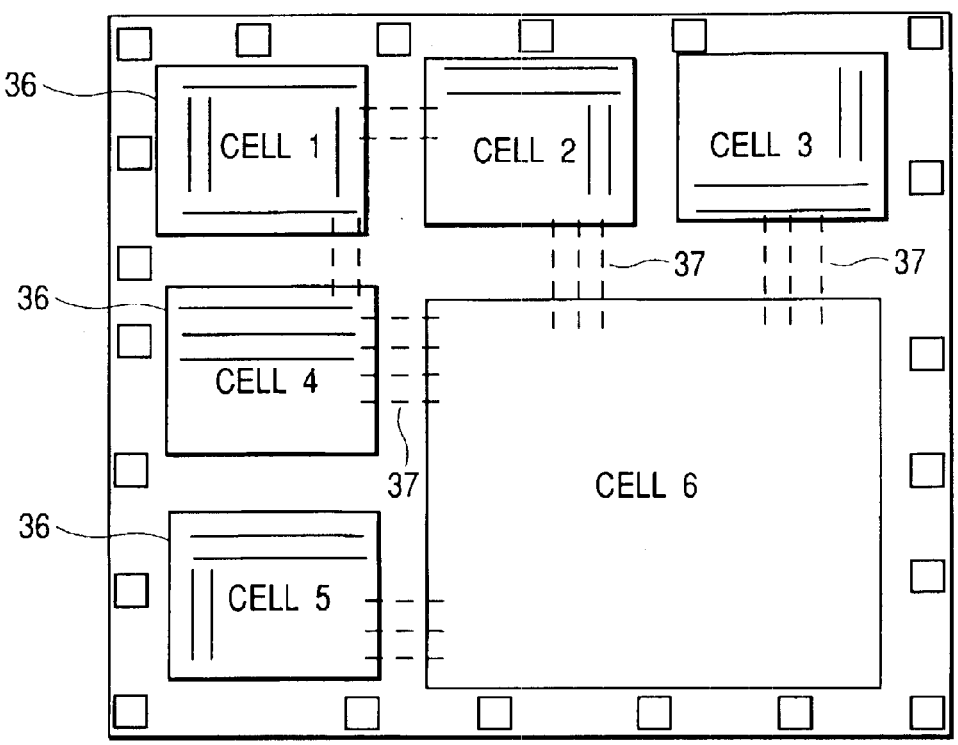
FIG. 14 is a plan showing a semiconductor device to which the invention is applied.

A sample using copper wiring for wiring for connecting cells in a semiconductor integrated circuit is produced by the semiconductor device provided with the wiring structure shown in FIG. 9. For comparison, a sample which uses aluminum wiring for wiring for connecting cells and which has aluminum wiring structure having the same wiring width and shown in FIG. 8 is produced. As a result of comparing the respective electric characteristics of the wirings for connecting cells in these two samples, it is verified that the sample using copper wiring for the wiring between cells transmits a signal at higher speed. As relatively thick and short wiring is used for wiring for connecting cells, it is verified that copper wiring is more advantageous in propagation velocity than aluminum wiring. In the meantime, as relatively long and minute wiring is often used for wiring in the same cell and in this case, the resistivity of aluminum wiring is smaller than that of copper wiring having the same width, aluminum wiring is more advantageous. FIG. 14 shows an example in which this is applied to an actual integrated circuit. The integrated circuit is composed of cells 1 to 6, wiring 36 in each cell is formed by aluminum wiring and wiring 37 for connecting each cell is formed by copper wiring. The integrated circuit the wiring resistance of which is reduced as a whole can be realized by suitably using aluminum wiring and copper wiring depending upon wiring width.

The semiconductor device which is provided with the multilayer interconnection layer, which transmits a signal at high speed and which has small resistance by using wiring material in consideration of wiring width and its manufacturing process can be provided.

What is claimed is:

1. A semiconductor device provided with both wiring made of Al or an Al alloy layer and wiring mainly made of a Cu conductive layer on the same substrate, wherein:

the wiring made of Al or the Al alloy layer is used for wiring having form in which the respective resistivities ρ of both wirings have the relation of $\rho_{Al} < \rho_{Cu}$; and the wiring mainly made of a Cu conductive layer is used for wiring having form in which the respective resistivities ρ of both wirings have the relation of $\rho_{Al} \geq \rho_{Cu}$.

2. A multilayer interconnection semiconductor device provided with both wiring made of Al or an Al alloy layer and wiring mainly made of a Cu conductive layer on the same substrate, wherein:

a wiring layer made of Al or the Al alloy layer is used for a layer including wiring having form in which the respective resistivities ρ of both wirings have the relation of $\rho_{Al} < \rho_{Cu}$; and a wiring layer mainly made of the Cu conductive layer is used for a layer including only wiring having form in which the respective resistivities ρ of both wirings have the relation of $\rho_{Al} \geq \rho_{Cu}$.

3. A semiconductor device provided with both wiring made of Al or an Al alloy layer and wiring mainly made of a Cu conductive layer on the same substrate wherein:

wiring having form that the thickness t of the wiring is smaller than 0.05 μm (t<0.05 μm) and the width w of the wiring is smaller than 0.11 μm (w<0.11 μm) is made by Al or the Al alloy layer.

4. A multilayer interconnection semiconductor device provided with both wiring made of Al or an Al alloy layer and wiring mainly made of a Cu conductive layer on the same substrate, wherein:

a wiring layer including wiring having form that the thickness t of the wiring is smaller than 0.05 μm (t<0.05 μm) and the width w of the wiring is smaller than 0.11 μm (w<0.11 μm) is formed by a wiring layer made of Al or the Al alloy layer.

5. A semiconductor device provided with both wiring made of Al or an Al alloy layer and wiring mainly made of a Cu conductive layer on the same substrate, wherein:

wiring having form that the thickness t of the wiring is equal to or larger than 0.05 μm and is smaller than 0.10 μm (0.05 μm<t<0.10 μm) and the width w of the wiring is smaller than 0.11 μm (w<0.11 μm) is formed by wiring made of Al or the Al alloy layer.

6. A semiconductor device according to claim 5, wherein: the width w of the wiring is smaller than 0.09 μm (w<0.09 μm).

7. A multilayer interconnection semiconductor device provided with both wiring made of Al or an Al alloy layer and wiring mainly made of a Cu conductive layer on the same substrate, wherein:

a wiring layer including wiring having form that the thickness t of the wiring is equal to or larger than 0.05 μm and is smaller than 0.10 μm (0.05 μm≦t<0.10 μm) and the width w of the wiring is smaller than 0.11 μm (w<0.11 μm) is formed by a wiring layer made of Al or the Al alloy layer.

8. A semiconductor device according to claim 7, wherein:
the width w of the wiring is smaller than 0.09 μm (w<0.09 μm).

9. A semiconductor device provided with both wiring made of Al or an Al alloy layer and wiring mainly made of a Cu conductive layer on the same substrate, wherein:
wiring having form that the width w of the wiring is smaller than 0.08 μm (w<0.08 μm) is formed by wiring made of Al or the Al alloy layer.

10. A multilayer interconnection semiconductor device provided with both wiring made of Al or an Al alloy layer and wiring mainly made of a Cu conductive layer on the same substrate, wherein:
a wiring layer including wiring having form that the width w of the wiring is smaller than 0.08 μm (w<0.08 μm) is formed by a wiring layer made of Al or the Al alloy layer.

11. A semiconductor device according to claim 2, wherein:
wiring mainly made of a Cu conductive layer is formed using a damascening process; and
wiring made of Al or an Al alloy layer is formed using a process except the damascening process.

12. A semiconductor device according to claim 4, wherein:
wiring mainly made of a Cu conductive layer is formed using a damascening process; and
wiring made of Al or an Al alloy layer is formed using a process except the damascening process.

13. A semiconductor device according to claim 5, wherein:
wiring mainly made of a Cu conductive layer is formed using a damascening process; and
wiring made of Al or an Al alloy layer is formed using a process except the damascening process.

14. A semiconductor device according to claim 7, wherein:
wiring mainly made of a Cu conductive layer is formed using a damascening process; and
wiring made of Al or an Al alloy layer is formed using a process except the damascening process.

15. A semiconductor device according to claim 2, wherein:
both wiring mainly made of a Cu conductive layer and wiring made of Al or an Al alloy layer are formed using a damascening process.

16. A semiconductor device according to claim 4, wherein:
both wiring mainly made of a Cu conductive layer and wiring made of Al or an Al alloy layer are formed using a damascening process.

17. A semiconductor device according to claim 5, wherein:
both wiring mainly made of a Cu conductive layer and wiring made of Al or an Al alloy layer are formed using a damascening process.

18. A semiconductor device according to claim 7, wherein:
both wiring mainly made of a Cu conductive layer and wiring made of Al or an Al alloy layer are formed using a damascening process.

19. A semiconductor device according to claim 4, wherein:
a film having the low dielectric constant k of 3.0 or less is used for an insulating film between wirings.

20. A semiconductor device according to claim 4, wherein:
wiring mainly made of a Cu conductive layer is used for wiring for connecting components formed on a substrate of a semiconductor device.

* * * * *